United States Patent
Snowman et al.

(10) Patent No.: US 6,176,944 B1
(45) Date of Patent: Jan. 23, 2001

(54) METHOD OF MAKING LOW MAGNETIC PERMEABILITY COBALT SPUTTER TARGETS

(75) Inventors: Alfred Snowman, Englewood, NJ (US); Holger Koenigsmann, Valley Cottage, NY (US); Andre Desert, Spring Valley, NY (US); Thomas J. Hunt, Peekskill, NY (US)

(73) Assignee: Praxair S.T. Technology, Inc., Danbury, CT (US)

( * ) Notice: Under 35 U.S.C. 154(b), the term of this patent shall be extended for 0 days.

(21) Appl. No.: 09/430,988

(22) Filed: Nov. 1, 1999

(51) Int. Cl.[7] .............................. H01F 1/00; C23C 14/34
(52) U.S. Cl. .................. 148/121; 148/120; 148/122; 148/510; 148/508; 148/509; 148/511; 148/538; 148/557; 148/674; 148/425; 148/DIG. 158; 204/298.13; 204/298.12; 204/192.2; 164/459
(58) Field of Search .................. 204/298.13, 298.12, 204/192.2; 148/120, 121, 122, 510, 508, 509, 511, 538, 557, 674, 425, DIG. 158; 164/459

(56) References Cited

U.S. PATENT DOCUMENTS

| | | | |
|---|---|---|---|
| 4,202,932 | * 5/1980 | Chen et al. | 428/667 |
| 4,832,810 | 5/1989 | Nakamura et al. | 204/192.15 |
| 5,112,468 | 5/1992 | Weigert et al. | 204/298.13 |
| 5,282,946 | 2/1994 | Kinoshita et al. | 204/298.13 |
| 5,334,267 | 8/1994 | Taniguchi et al. | 148/425 |
| 5,468,305 | 11/1995 | Uchida et al. | 148/120 |
| 5,728,279 | * 3/1998 | Schlott et al. | 204/298.13 |
| 5,810,983 | * 9/1998 | Shindo et al. | 204/298.13 |

FOREIGN PATENT DOCUMENTS

| | | |
|---|---|---|
| 3-115562 | * 5/1991 | (JP). |
| 3-115564 | * 5/1991 | (JP). |
| WO 99/10548 | * 3/1999 | (WO). |

* cited by examiner

Primary Examiner—Alan Diamond
(74) Attorney, Agent, or Firm—Blake T. Biederman

(57) ABSTRACT

The present invention provides a high purity cobalt sputter target having a single phase h.c.p. structure and a magnetic permeability less than the intrinsic magnetic permeability of the material. Substantially pure cobalt is cast and slowly cooled, such as at a rate of 15° C./min. Or less, to form a cast target of single phase h.c.p. crystallographic structure. This cast target is hot worked at a temperature of at least about 1000° C. to impart a strain of about 65% or greater into the cobalt material, followed by a slow, controlled cooling to room temperature, such as at a rate of 15° C./min. or less, to maintain the single phase h.c.p. crystallographic structure. The cooled target is then cold worked at substantially room temperature to impart a strain of about 5–20%. The sputter target of the present invention processed by this method has a magnetic permeability of less than about 9, grain sizes in the size range of about 70–160 μm, and average grain size of about 130 μm.

14 Claims, 1 Drawing Sheet

METHOD OF MAKING LOW MAGNETIC PERMEABILITY COBALT SPUTTER TARGETS

RELATED APPLICATIONS

The present application relates generally to subject matter contained in the following commonly owned, pending applications: Ser. No. 09/377,587, entitled "Low Permeability Non-Planar Ferromagnetic Sputter Targets" filed Aug. 19, 1999 in the name of Xiong et al. And Ser. No. 09/413,073, entitled "High Magnetic Flux Sputter Targets With Varied Magnetic Permeability in Selected Regions" filed Oct. 6, 1999 in the name of Xiong et al.

FIELD OF THE INVENTION

The present invention relates to pure cobalt sputter targets having low magnetic permeability thereby improving magnetic leakage flux at the surface of the target during cathode magnetos sputtering.

BACKGROUND OF THE INVENTION

Sputter targets made of ferromagnetic materials are critical to thin film deposition in industries such as data storage and VIS (very large scale integration)/semiconductors. Magnetos cathode sputtering is one means of sputtering magnetic thin films.

The cathode sputtering process involves ion bombardment of a target composed of a ferromagnetic material. The target forms part of a cathode assembly in an evacuated chamber containing an inert gas, such as argon. An electric field is applied between the cathode assembly and an anode in the chamber, and the gas is ionized by collision with electrons ejected from the surface of the cathode, forming a plasma between the target surface and the substrate. The positive gas ions are attracted to the cathode surface, and particles of material dislodged when the ions strike the target then traverse the enclosure and deposit as a thin film onto a substrate or substrates positioned on a support maintained at or near anode potential.

Although the sputtering process can be carried out solely in an electric field, substantially increased deposition rates are possible with magnetos cathode sputtering, in which an arched magnetic field, formed in a closed loop over the surface of the sputter target, is superimposed on the electric field. The arched closed-loop magnetic field traps electrons in an annular region adjacent to the surface of the target, thereby multiplying the collisions between electrons and gas atoms to produce a corresponding increase in the number of ions in that region. The magnetic field is typically created by placing one or more magnets behind the target. This produces a leakage magnetic field on the surface of the target so that the plasma density may be increased.

Erosion of particles from the sputter target surface generally occurs in a relatively narrow ring-shaped region corresponding to the shape of the closed-loop magnetic field. Only the portion of the total target material in this erosion groove, the so-called "race track" region, is consumed before the target must be replaced. The result is that typically only 18–25% of the target material is utilized. Thus, a considerable amount of material, which is generally very expensive, is either wasted or must be recycled. Furthermore, a considerable amount of deposition equipment "down-time" occurs due to the necessity of frequent target replacement.

To solve these disadvantages of the magnetos sputtering process, various possible solutions have been pursued. One potential solution is to increase the thickness of the target. If the target is relatively thick, then sputtering can proceed for a longer period of time before the race track region is consumed. Ferromagnetic materials, however, present a difficulty not encountered with non-ferromagnetic materials. For magnetron sputtering, the magnetic leakage flux (MLF) or leakage magnetic field at the target surface must be high enough to start and sustain the plasma. Under normal sputtering conditions, such as a chamber pressure of 3–10 mTorr, the minimum MLF, also known as pass through flux (PTF), is approximately 150 gauss at the sputtering surface, and preferably is about 200 gauss for high speed sputtering. The cathode magnet strength in part determines the MLF. The higher the magnet strength, the higher the MLF. In the case of ferromagnetic sputter targets, however, the high intrinsic magnetic permeability of the material effectively shields or shunts the magnetic field from the magnets behind the target and hence reduces the MLF on the target surface in proportion to the target thickness.

For air and non-ferromagnetic materials, magnetic permeability is very close to 1.0. Ferromagnetic materials, as referred to herein, are those materials having an intrinsic magnetic permeability greater than 1.0. Magnetic permeability describes the response (magnetization) of a material under a magnetic field. In CGS units, it is defined as:

$$\text{Magnetic Permeability} = 1 + 4\pi(M/H)$$

where M is the magnetization and H is the magnetic field. For currently available cobalt sputter targets, the magnetic permeability is approximately 12 or higher.

Because of high magnetic permeability and thus low MLF, and because MLF decreases with increasing target thickness, ferromagnetic sputter targets are generally made much thinner than non-magnetic sputter targets to allow enough magnetic field to be leaked out to the sputtering surface to sustain the sputtering plasma necessary for magnetos sputtering. Non-ferromagnetic targets are typically 0.25 inch thick or greater, whereas ferromagnetic targets are generally less than 0.25 inch thick. Thus, not only can these ferromagnetic targets not simply be made thicker so as to reduce equipment down-time, they must actually be made thinner. To increase thickness, the MLF must somehow be increased.

In the particular case of cobalt sputter targets, the continuing size reduction and increased speed of silicon based integrated circuits has created a need for high purity cobalt targets. Low resistivity contacts with high thermal stability are required for these silicon based integrated circuits, and $CoSi_2$ is one such contact material. Previously, these contact films were deposited using silicide targets, but these targets, which were made by powder metallurgy processes, had low purity, low density and were frequently non homogeneous. Alternatively, this $CoSi_2$ film can be grown by vacuum deposition of cobalt onto a silicon substrate, followed by heating to about 500° C. To thereby form the $CoSi_2$ contact material. For this method, high purity cobalt targets are needed. Furthermore, due to the need for sufficient MLF at the surface of the target for starting and sustaining the plasma, these high purity cobalt targets further require a low magnetic permeability, specifically, lower than the intrinsic permeability of the material.

Several prior developments relate to the reduction of permeability in cobalt-based alloy sputter targets. In U.S. Pat. No. 4,832,810, the permeability is said to be decreased by decreasing the ratio of the f.c.c. (face centered cubic) phase to the h.c.p. (hexagonal close packed) phase. This is purportedly achieved by melting a cobalt-based alloy having a f.c.c. single phase, casting it, and cooling it so as to transform part of the f.c.c. phase into an h.c.p. phase, followed by cold working. The alloy may optionally be hot worked prior to cooling.

In U.S. Pat. No. 5,282,946, the permeability of a platinum-cobalt alloy is said to be decreased by casting the alloy, annealing at 400–700° C., hot working the alloy at a temperature above the recrystallization temperature (i.e., above about 300° C.) to a strain of at least 30%, and cold (or warm) working at a temperature less than the recrystallization temperature.

In U.S. Pat. No. 5,334,267, the permeability of a Co—Ni—Cr—V alloy of f.c.c. structure is said to be decreased by casting the alloy, hot rolling, and cold or warm working to cause work strain to remain in the target.

In U.S. Pat. No. 5,112,468, the permeability of a cobalt alloy with an h.c.p. and cubic structure is said to be decreased by maximizing the h.c.p. Phase and aligning the hexagonal prism axes vertically to the target surface. This is purportedly achieved by casting and forging the alloy, hot rolling at 800° C.–1200° C., followed by quenching and cold (or warm) working below 400° C.

In U.S. Pat. No. 5,468,305, the permeability of a cobalt alloy is said to be decreased by a multiple hot rolling step with a total reduction of 30% or more, followed by cold rolling at a reduction of 10% or less.

In each of these references, the particular alloy or alloys involved presented different parameters that had to be addressed in determining how to lower the permeability of the particular cobalt alloy. Crystal structure, intrinsic permeability, workability, etc. Vary from one alloy to another. None of these references address the particular parameters presented with substantially pure cobalt sputter target materials. For example, the cobalt alloys had f.c.c single phase or multiple phase structures, whereas pure cobalt has a single phase h.c.p. structure at room temperature. Furthermore, as pure cobalt has a lower intrinsic permeability than cobalt alloys, reduction in permeability is more difficult to achieve.

There is thus a need to develop a pure cobalt sputter target and method for manufacturing the same that exhibits low magnetic permeability sufficient for increasing the magnetic leakage flux at the surface of the sputter target.

SUMMARY OF THE INVENTION

The present invention provides a high purity cobalt sputter target having a single phase h.c.p. structure and a magnetic permeability less than the intrinsic magnetic permeability of the material. To this end, and in accordance with the principles of the present invention, substantially pure cobalt is cast and slowly cooled, such as at a rate of 15° C./min. or less, to form a cast target having a single phase h.c.p. crystallographic structure. This cast target is hot worked at a temperature of at least about 1000° C. to impart a strain of about 65% or greater into the cobalt material, followed by a slow, controlled cooling to room temperature, such as at a rate of 15° C./min. or less, to obtain the equilibrium single phase h.c.p. crystallographic structure. The cooled target is then cold worked at substantially room temperature to impart a strain of about 5–20%. The sputter target of the present invention processed by this method has a magnetic permeability of less than about 9. In one embodiment of the present invention, the sputter target further comprises grains in the size range of about 70–160 μm. In another embodiment of the present invention, the sputter target comprises grains having an average size of about 130 μm.

The above and other objects, features and advantages of the present invention will become more apparent upon consideration of the accompanying drawings and detailed description of the invention.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION OF THE INVENTION

Figure 1:
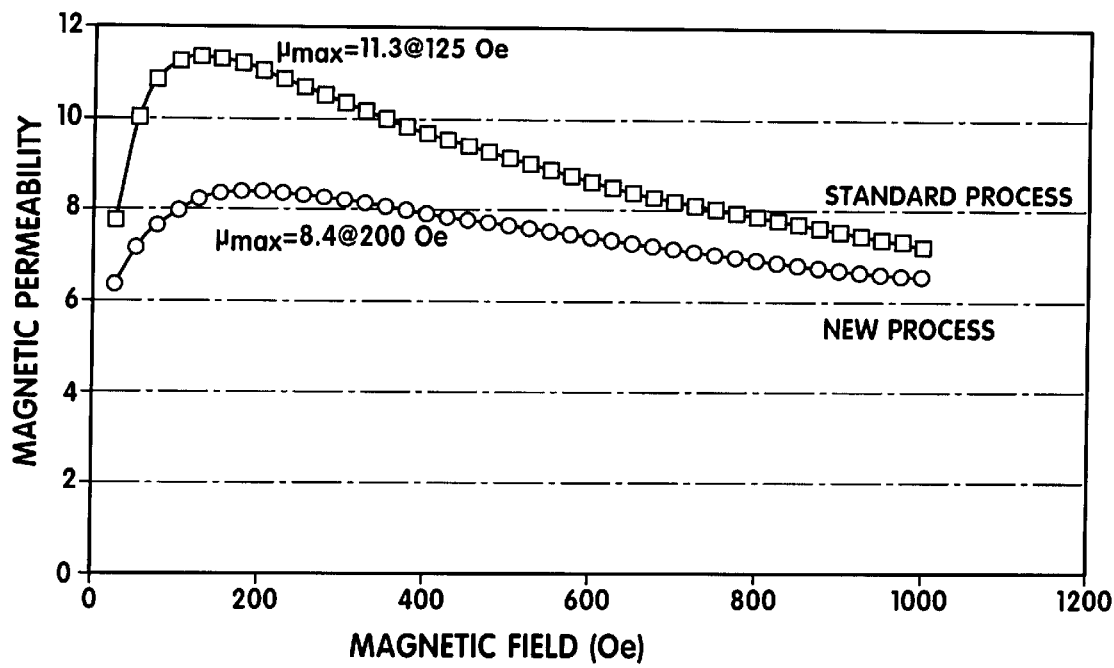
FIG. 1 is a plot of magnetic field vs. Magnetic permeability.

The present invention provides low magnetic permeability cobalt sputter targets. The low magnetic permeability is achieved by the combination of hot working and cold working and slow controlled cooling to achieve and maintain a single phase h.c.p. crystallographic structure in the substantially pure cobalt material. The low magnetic permeability of the ferromagnetic, high purity cobalt material used for the sputter targets of the present invention results in a significant increase in the MLF at the surface of the cobalt targets and a lowering of the argon pressure needed to obtain stable plasma. The low magnetic permeability of the ferromagnetic, high purity cobalt material further allows for an increase in target thickness, which produces a longer target life and decreases the frequency of target replacements. The low magnetic permeability enables high rate deposition at an equivalent or lower magnetos field strength, which contributes to improved film magnetic properties, and the uniformity of both the film thickness and the sheet resistance is improved. Low magnetic permeability targets also lead to wider sputtering erosion grooves or zones, and hence higher target utilization, which is extremely important in reducing waste for these expensive targets. Moreover, the sputter targets of the present invention provide the high purity, high density and homogeneity necessary for growing $CoSi_2$ film by vacuum deposition of cobalt onto silicon substrates.

The cobalt material comprising the sputter targets of the present invention will advantageously have a purity of at least about 99.99%, by weight. This high purity cobalt metal having a h.c.p. single phase is cast, such as by heating the metal at a temperature above the melting point of cobalt (i.e. above 1495° C.) In an argon-purged vacuum furnace until melted and pouring it into a mold, and allowed to slowly cool in air to room temperature. The rate of cooling is controlled so as to maintain the single phase h.c.p. structure of the cobalt metal. This may be achieved by cooling at a rate of about 15° C./min. Or less. This cast cobalt material will typically have a magnetic permeability of about 15 or greater and grains on the order of 1000 μm in size.

To eliminate the cast grain structure of the cobalt material, and to further shape the cast metal into a desired configuration for the sputter target, the cast sputter target is hot worked, such as by forging, rolling, stamping, press forming or extrusion. This thermomechanical treatment is conducted at an elevated temperature to minimize cracking. Advantageously, the temperature for hot working is at least about 1000° C. The material is hot worked until a strain of at least about 65% is achieved. Strain, as defined herein, is measured by the following formula:

$$\text{strain} = \Delta t / t_0 \times 100$$

wherein $\Delta t$ and $t_0$ denote the amount of thickness reduction and the thickness prior to the working operation, respectively. The resulting hot worked target has a h.c.p. equilibrium structure.

The hot worked target is then slowly cooled in air to room temperature, with the rate of cooling being controlled so as to obtain the equilibrium single phase h.c.p. crystallographic structure. This may be achieved by cooling at a rate of about 15° C./min. or less.

The hot worked target is then subjected to cold working, such as cold rolling, at room temperature to introduce deformation-induced residual stress within the material. The material is cold worked until a strain of about 5–20% is achieved. In one embodiment of the present invention, the material is cold worked to a strain of about 10%. At strains less than 5%, the change in MLF is either non-appreciable or non-sufficient to justify the additional processing step. At strains above 20%, there is a high risk that the target material will fracture.

The combination of hot and cold work, together with slow, controlled cooling results in an equipped, uniform grain structure of grain size ranging from about 70 $\mu$m to about 160 $\mu$m, an average grain size of about 130 $\mu$m and a crystallographic texture consisting of more than about 95% of the (102) orientation. Furthermore, the sputter target of the present invention is high purity cobalt of magnetic permeability less than about 9.

The above-described processing sequence and parameters were designed to address the material aspects characteristic of substantially pure cobalt. The introduction of deformation-induced residual stress by combined hot and cold working together with the maintenance of a single phase h.c.p. structure achieved a significant lowering of the magnetic permeability of the cobalt sputter target from the intrinsic value of the pure cobalt material.

EXAMPLE

Figure 2:
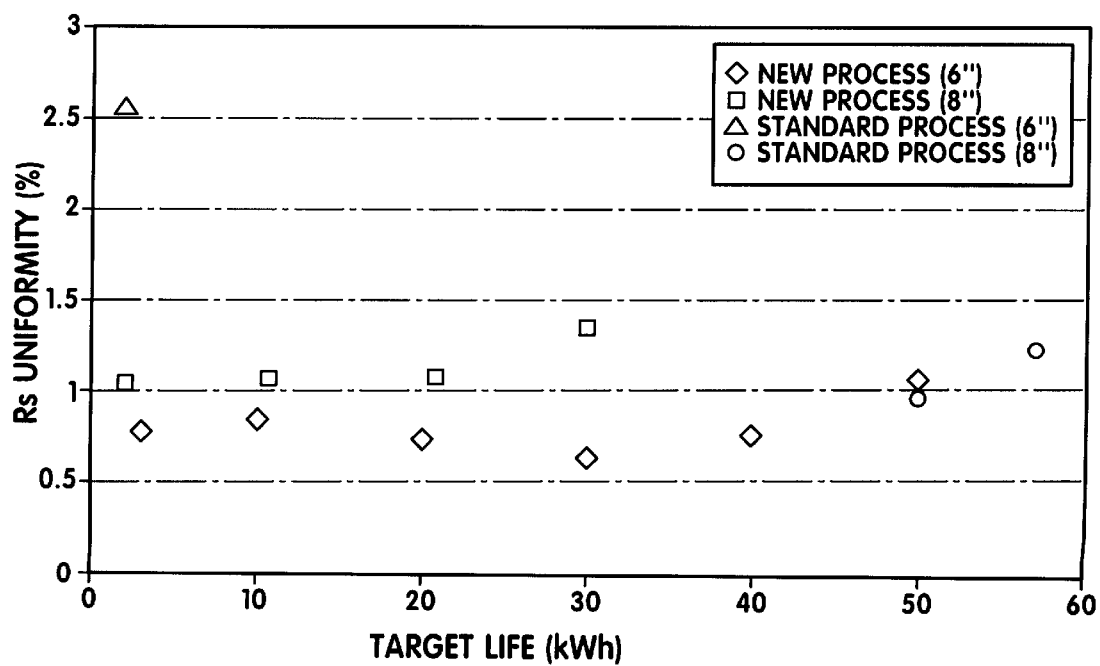
FIG. 2 is a plot of target life vs. Sheet resistance uniformity.

Two sample targets were manufactured and sputtered on both 6 inch and 8 inch wafers under identical testing conditions. Both targets were cast, slowly cooled to room temperature at a controlled rate of approximately 15° C./min., subsequently hot rolled at a temperature of approximately 1150° C. to a 70% strain and slowly cooled to room temperature at a controlled rate of approximately 15° C./min. One of the targets was then further processed according to the principles of the present invention by cold rolling at room temperature to a strain of about 10%. FIG. 1 shows plots of magnetic permeability vs. The magnetic field for the two targets. The target further subjected to cold rolling according to the principles of the present invention displayed a maximum magnetic permeability of about 25% less than the target not further subjected to cold rolling. The lower magnetic permeability throughout sputtering also contributed to easier igniting of the plasma and enhanced plasma uniformity at the surface of the sputter target. In addition, as shown in FIG. 2, the target subjected to cold working according to the principles of the present invention displayed good sheet resistance uniformity throughout target life. Sheet resistance uniformity (1$\sigma$) for the target that was not subjected to cold rolling was measured immediately after burn-in (about 2 kWh) and exhibited a very high sheet resistance uniformity at the beginning of target life. The sheet resistance uniformity for the target that was not subjected to cold rolling was measured at the end of target life, showing that such targets may achieve lower sheet resistance uniformity toward the end of the sputtering process.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method for manufacturing low magnetic permeability cobalt sputter targets, comprising the steps of:
   casting a substantially pure cobalt metal having an intrinsic magnetic permeability and slowly cooling the metal at a controlled rate to form a substantially pure cobalt sputter target having a single hexagonal close packed phase;
   hot working the sputter target at a temperature of at least about 1000° C. to a strain of at least about 65%;
   slowly cooling the hot worked sputter target at a controlled rate to maintain the single hexagonal close packed phase; and
   cold working the hot worked sputter target at substantially room temperature to a strain of about 5% to about 20%, wherein the cold worked sputter target has a magnetic permeability less than the intrinsic magnetic permeability.

2. The method of claim 1, wherein the cast metal is cooled at a controlled rate of no greater than about 15° C./main to form the sputter target.

3. The method of claim 1, wherein the hot worked sputter target is cooled at a controlled rate of no greater than about 15° C./min.

4. The method of claim 1, wherein the cold worked sputter target has a magnetic permeability of less than about 9.

5. The method of claim 1, wherein the cold worked sputter target comprises grains in the size range of about 70 $\mu$m to about 160 $\mu$m.

6. The method of claim 1, wherein the cold worked sputter target comprises grains having an average size of about 130 $\mu$m.

7. The method of claim 1, wherein the cobalt metal has a purity of at least about 99.99%, by weight.

8. The method of claim 1, wherein the hot worked target is cold worked to a strain of about 10%.

9. A method for manufacturing low magnetic permeability cobalt sputter targets, comprising the steps of:
   casting a substantially pure cobalt metal having an intrinsic magnetic permeability and cooling the metal at a controlled rate of no greater than about 15° C./min. to form a substantially pure cobalt sputter target having a single hexagonal close packed phase;
   hot working the sputter target at a temperature of at least about 1000° C. to a strain of at least about 65%;
   cooling the hot worked sputter target at a controlled rate of no greater than about 15° C./min. to maintain the single hexagonal close packed phase; and
   cold working the hot worked sputter target at substantially room temperature to a strain of about 5% to about 20%, wherein the cold worked sputter target has a magnetic permeability less than the intrinsic magnetic permeability.

10. The method of claim 9, wherein the cold worked sputter target has a magnetic permeability of less than about 9.

11. The method of claim 9, wherein the cold worked sputter target comprises grains in the size range of about 70 µm to about 160 µm.

12. The method of claim 9, wherein the cold worked sputter target comprises grains having an average size of about 130 µm.

13. The method of claim 9, wherein the cobalt metal has a purity of at least about 99.99%, by weight.

14. The method of claim 9, wherein the hot worked target is cold worked to a strain of about 10%.

* * * * *